(12) United States Patent
Liggiero, III et al.

(10) Patent No.: US 7,664,621 B2
(45) Date of Patent: Feb. 16, 2010

(54) SYSTEM AND METHOD FOR MAPPING SYSTEM TRANSFER FUNCTIONS

(75) Inventors: Richard Liggiero, III, Tewksbury, MA (US); Alan J. Reiss, Wayland, MA (US); Philip E. Perkins, Needham, MA (US)

(73) Assignee: LTX Corporation, Norwood, MA (US)

( * ) Notice: Subject to any disclaimer, the term of this patent is extended or adjusted under 35 U.S.C. 154(b) by 0 days.

(21) Appl. No.: 12/118,248

(22) Filed: May 9, 2008

(65) Prior Publication Data

US 2009/0039920 A1 Feb. 12, 2009

Related U.S. Application Data

(60) Provisional application No. 60/954,439, filed on Aug. 7, 2007.

(51) Int. Cl.
*G01R 29/00* (2006.01)
*G06F 13/00* (2006.01)

(52) U.S. Cl. .................. 702/189; 702/109; 702/124; 327/100

(58) Field of Classification Search ............... 702/189, 702/109, 124
See application file for complete search history.

(56) References Cited

U.S. PATENT DOCUMENTS

| 4,486,688 A | * | 12/1984 | Schmitz | 315/83 |
| 6,850,044 B2 | * | 2/2005 | Hansen et al. | 323/266 |
| 2005/0078026 A1 | * | 4/2005 | Cai | 341/162 |

* cited by examiner

*Primary Examiner*—Hal D Wachsman
(74) *Attorney, Agent, or Firm*—Holland & Knight LLP; Brian J Colandreo, Esq.; Mark H. Whittenberger

(57) ABSTRACT

The present disclosure relates to a system and method for mapping system transfer functions. Accordingly, some operations may include receiving a first intermediate signal that is at least partially based upon a first reference signal. A second intermediate signal is received that is at least partially based upon a second reference signal. An output signal is generated that is based upon the difference between the first intermediate signal and the second intermediate signal. A first anticipated differential change in the output signal is determined, the first anticipated differential change to occur based upon a transition in the first reference signal. A second anticipated differential change in the output signal is determined, the second anticipated differential change to occur based upon a transition in the second reference signal. Numerous other operations are also within the scope of the present disclosure.

21 Claims, 3 Drawing Sheets

SYSTEM AND METHOD FOR MAPPING SYSTEM TRANSFER FUNCTIONS

RELATED APPLICATIONS

This disclosure claims the benefit of U.S. Provisional Patent Application No. 60/954,439, which is entitled "RELATIVE SWITCHING DIFFERENTIAL MEASUREMENT" and was filed on 7 Aug. 2007.

TECHNICAL FIELD

This disclosure relates to analyzing distortion of a device and, more particularly, to the measurement and determination of distortion characteristics as they relate to a system transfer function.

BACKGROUND

When measuring the nonlinearity distortion imparted by a device under test, the device under test is typically driven by a reference signal and the device under test provides an intermediate signal as a result. Upon transitions of the reference signal, differential changes in the intermediate signal are measured and compared to their expected values according to the intended transfer function of the device under test. As these differential changes are typically very small, the required measurement accuracy may be compromised when the signal to be measured is buried within the noise floor. Therefore, a notch and gain approach may be used to measure them. A difference and gain approach typically involves providing the intermediate signal to one terminal of a differential amplifier, and providing a base signal to the other terminal of the differential amplifier. As the base signal is close in amplitude to that of the intermediate signal, the base signal nearly cancels out (i.e. notches) the intermediate signal and the differential amplifier then amplifies the difference between the two signals and provides this amplified difference in the form of an output signal. Upon a transition in the reference signal, the resulting differential change in the output signal is measured rather than the intermediate signal, and compared to an anticipated value.

There are two traditional methods of providing the base signal. A first method involves connecting a variable bucking or Pedestal source as a base signal reference. This method is often used when testing the nonlinearity of a Digital-to-Analog Converter (DAC). To save testing time and expense for this type of DAC, it is common to test transitions only at the "major carries." As is known in the art, "major carries" are transitions wherein the next major bit (on a digital reference signal) changes from a zero to a one. This occurs when the lower order bits are all ones and in the transition become all zeroes such that they have 'carried over' to the next adjacent higher order bit. For example, a transition from B0111 to B1000 is a "major carry" transition (i.e., for a four bit DAC with the Segmentation 1/3). When utilizing the "major carry" method, a variable source provides the base signal and is set to a value at or near the DAC's output value while the reference signal is one of the major carry values. The reference signal is then incremented (or decremented) and the differential change is measured through the notch and gain technique as described above. The problem with this method is that it requires an expensive second device (i.e., the variable source) capable of precisely generating a range of values at or near the major carry output value of the DAC, as well as maintaining this signal level/stability, over the entire measurement acquisition time.

A second method of providing a base signal gained popularity with the acceptance of segmented DACs. This second method involves using a second DAC, superior to the device under test, as the base signal reference source. In this method, the second DAC (i.e. the reference DAC) is driven by the same reference signal that drives the device under test. Because the reference DAC changes its output at the same time as the device under test, it is always supplying a reference signal at or near the output value of the device under test. In other words, the reference signal is stepping (i.e. bucking) in sync with the device under test. Accordingly, the reference DAC is often referred to as a "bucking DAC". Unfortunately with respect to this method, the differential change measured by the notch and gain technique is now a combination of the differential changes of the outputs of both the device under test and the bucking DAC, because they each change at the same time in response to the reference signal. Therefore, the characteristics of the bucking DAC must be well known in order to isolate the nonlinearity of the device under test. Accordingly, the bucking DAC must have a higher resolution, be more stabile, have greater accuracy, and make less noise than the device under test.

SUMMARY OF THE DISCLOSURE

In a first implementation, a method includes receiving a first intermediate signal that is at least partially based upon a first reference signal. A second intermediate signal is received that is at least partially based upon a second reference signal. An output signal is generated that is based upon the difference between the first intermediate signal and the second intermediate signal. A first anticipated differential change in the output signal is determined, the first anticipated differential change to occur based upon a transition in the first reference signal. A second anticipated differential change in the output signal is determined, the second anticipated differential change to occur based upon a transition in the second reference signal. A first realized differential change in the output signal is measured, the first realized differential change occurring based upon a transition in the first reference signal. A second realized differential change in the output signal is measured, the second realized differential change occurring based upon a transition in the second reference signal. The first realized differential change in the output signal is compared to the first anticipated differential change in the output signal to determine a first nonlinearity indicator. A second realized differential change in the output signal is compared to the second anticipated differential change in the output signal to determine a second nonlinearity indicator.

One or more of the following features may be included. The first reference signal may be a first digital reference signal. The first digital reference signal may be provided to a device under test such that the device under test generates the first intermediate signal. The device under test may include a digital-to-analog converter.

The first reference signal may be a first analog reference signal. The first analog reference signal may be provided to a device under test such that the device under test generates the first intermediate signal. The device under test may include an amplifier.

In another implementation, a circuit is configured to perform operations including receiving a first intermediate signal that is at least partially based upon a first reference signal. A second intermediate signal is received that is at least partially based upon a second reference signal. An output signal is generated that is based upon the difference between the first intermediate signal and the second intermediate signal. A first anticipated differential change in the output signal is determined, the first anticipated differential change to occur based upon a transition in the first reference signal. A second anticipated differential change in the output signal is determined, the second anticipated differential change to occur based upon a transition in the second reference signal. A first realized differential change in the output signal is measured, the first realized differential change occurring based upon a transition in the first reference signal. A second realized differential change in the output signal is measured, the second realized differential change occurring based upon a transition in the second reference signal. The first realized differential change in the output signal is compared to the first anticipated differential change in the output signal to determine a first nonlinearity indicator. A second realized differential change in the output signal is compared to the second anticipated differential change in the output signal to determine a second nonlinearity indicator.

One or more of the following features may be included. The first reference signal may be a first digital reference signal. The first digital reference signal may be provided to a device under test such that the device under test generates the first intermediate signal. The device under test may include a digital-to-analog converter.

The first reference signal may be a first analog reference signal. The first analog reference signal may be provided to a device under test such that the device under test generates the first intermediate signal. The device under test may include an amplifier.

In another implementation, a computer program product resides on a computer readable medium that has a plurality of instructions stored on it. When executed by a processor, the instructions cause the processor to perform operations including receiving a first intermediate signal that is at least partially based upon a first reference signal. A second intermediate signal is received that is at least partially based upon a second reference signal. An output signal is generated that is based upon the difference between the first intermediate signal and the second intermediate signal. A first anticipated differential change in the output signal is determined, the first anticipated differential change to occur based upon a transition in the first reference signal. A second anticipated differential change in the output signal is determined, the second anticipated differential change to occur based upon a transition in the second reference signal. A first realized differential change in the output signal is measured, the first realized differential change occurring based upon a transition in the first reference signal. A second realized differential change in the output signal is measured, the second realized differential change occurring based upon a transition in the second reference signal. The first realized differential change in the output signal is compared to the first anticipated differential change in the output signal to determine a first nonlinearity indicator. A second realized differential change in the output signal is compared to the second anticipated differential change in the output signal to determine a second nonlinearity indicator.

One or more of the following features may be included. The first reference signal may be a first digital reference signal. The first digital reference signal may be provided to a device under test such that the device under test generates the first intermediate signal. The device under test may include a digital-to-analog converter.

The first reference signal may be a first analog reference signal. The first analog reference signal may be provided to a device under test such that the device under test generates the first intermediate signal. The device under test may include an amplifier.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE DISCLOSURE

Figure 1:
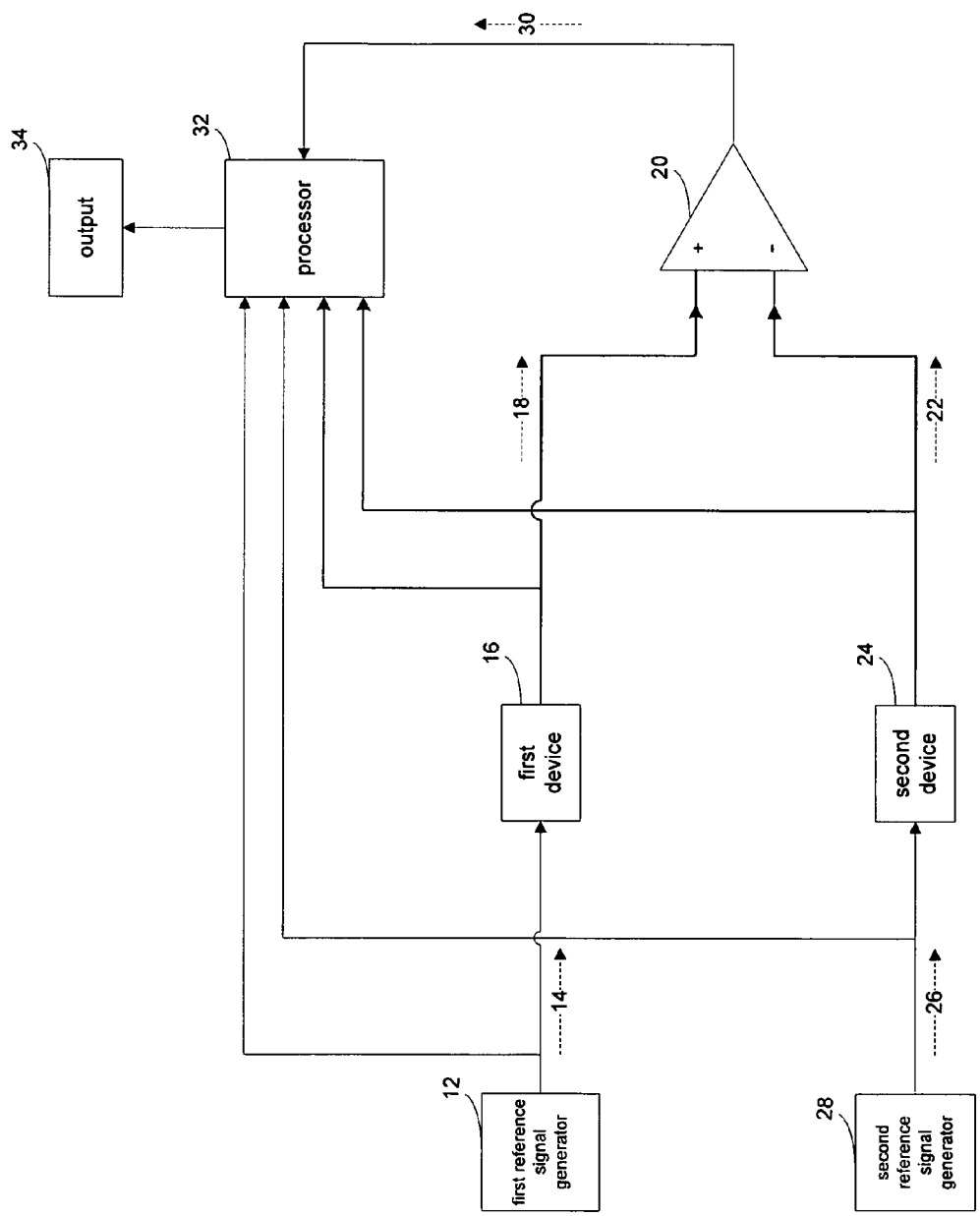
FIG. 1 is a block diagram of a transfer function mapping system.

Referring to FIG. 1, there is shown transfer function mapping system 10 for measuring the nonlinearity of devices under test. First reference signal generator 12 may apply first reference signal 14 to first device 16, and the resulting intermediate signal 18 generated by first device 16 may be provided to one terminal of comparator 20. A typical example of comparator 20 may include but is not limited to AD8250 manufactured by ADI of Norwood, Mass.

In situations in which first device 16 is ideally expected to respond in a linear fashion to input signals (e.g., first reference signal 14), monitoring first intermediate signal 18 in relation to first reference signal 14 may provide the capability of determining the nonlinear characteristics of first device 16. Further, second intermediate signal 22 may be generated by second device 24 in response to second reference signal 26 (provided by second reference signal generator 28), thus providing the capability of determining the nonlinear characteristics of second device 24. Examples of first signal generator 12 and/or second signal generator 28 may include but are not limited to an automatic electronic tester manufactured by LTX Corporation of Norwood, Mass.

Examples of first reference signal 14 and second reference signal 26 may include, but are not limited to, an analog reference signal and a digital reference signal. If first reference signal 14 and/or second reference signal 26 is a digital signal, the device to which first reference signal 14 and/or second reference signal 26 is applied (namely first device 16 and/or second device 24) must be a device capable of receiving a digital signal (unless a digital-to-analog converter is utilized). Conversely, if first reference signal 14 and/or second reference signal 26 is an analog signal, the device to which first reference signal 14 and/or second reference signal 26 is applied (namely first device 16 and/or second device 24) must be a device capable of receiving an analog signal (unless a analog-to-digital converter is utilized).

First device 16 may be a device under test; and the type of signal applied to first device 16 may vary depending on the type of device being tested. For example and for illustrative purposes only, if first device 16 is a digital-to-analog converter, first reference signal 14 may be a digital signal applied to the digital-to-analog converter. Alternatively, if first device 16 is an analog amplifier, first reference signal 14 may be an analog signal (that may be capable of defining one or more discrete voltage steps).

Further, second device 24 may be a device under test; and the type of signal applied to second device 24 may vary depending on the type of device being tested. For example and for illustrative purposes only, if second device 24 is a digital-to-analog converter, second reference signal 26 may be a digital signal applied to the digital-to-analog converter. Alternatively, if second device 24 is an analog amplifier, second reference signal 26 may be an analog signal (that may be capable of defining one or more discrete voltage steps).

Figure 2:
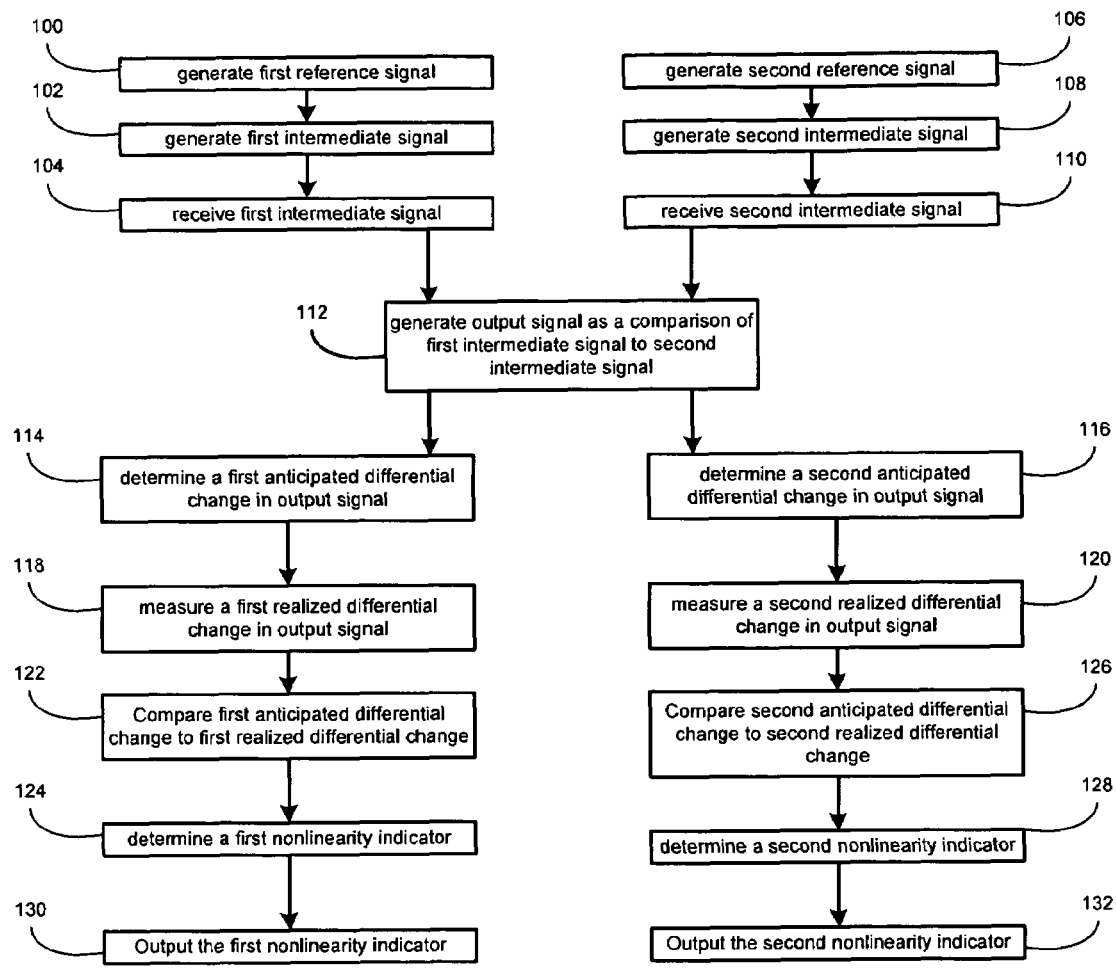
FIG. 2 is a flowchart of a process executed by the transfer function mapping system of FIG. 1.

For illustrative purposes and referring also to FIG. 2, first reference signal generator 12 may generate 100 first reference signal 14 that may be applied to first device 16. First device 16 may process first reference signal 14 and generate 102 first intermediate signal 18, which may be received 104 by comparator 20 and responsive to first reference signal 14.

As discussed above and for illustrative purposes only, first device 16 may be a digital-to-analog converter or an amplifier. Accordingly, if first device 16 is a digital-to-analog converter, first reference signal 14 generated 100 by first reference signal generator 12 may be a digital reference signal, which may be processed by the digital-to-analog converter (i.e., first device 16) to generate 102 first intermediate signal 18 (e.g., an analog representation of the digital reference signal).

Further, if first device 16 is an amplifier, first reference signal 14 generated 100 by first reference signal generator 12 may be an analog reference signal, which may be processed by the amplifier (i.e., first device 16) to generate 102 first intermediate signal 18 (e.g., an amplified representation of the analog reference signal).

Since first intermediate signal 18 is at least partially based upon first reference signal 14, a variation in first reference signal 14 may cause a variation in first intermediate signal 18. Therefore, a transition in first reference signal 14 (e.g., a change in value such as, but not limited to, a change in the binary word in the case of a digital signal or a change in voltage in the case of an analog signal) may result in a transition in first intermediate signal 18. Unfortunately, due to variations in the internal structure of first device 16, first intermediate signal 18 may not vary linearly with respect to first reference signal 14.

Further, second reference signal generator 28 may generate 106 second reference signal 26 that may be applied to second device 24. Second device 24 may process second reference signal 26 and generate 108 second intermediate signal 22, which may be received 110 by comparator 20 and responsive to second reference signal 26.

Since second intermediate signal 22 is at least partially based upon second reference signal 26, a variation in second reference signal 26 may cause a variation in second intermediate signal 22. Therefore, a transition in second reference signal 26 may result in a transition in second intermediate signal 22. As with first device 16, due to variations in the internal structure of second device 24, second intermediate signal 22 may not vary linearly with respect to second reference signal 26.

In order to accurately test the nonlinearity of first device 16, a comparison of first intermediate signal 18 and second intermediate signal 22 may be made (e.g., through a notch & gain technique). In similar fashion, to test the nonlinearity of second device 24, a comparison of second intermediate signal 22 and first intermediate signal 18 may be made (e.g., through a notch & gain technique). As will be discussed below in greater detail, through the use of transfer function mapping system 10, the nonlinearity of both first device 16 and second device 24 may be tested essentially simultaneously, first device 16 being tested when first reference signal 18 makes a transition and second device 24 being tested when second reference signal 22 makes a transition. When testing the nonlinearity of a digital-to-analog converter, transfer function mapping system 10 may allow two digital-to-analog converters to be tested side-by-side and may eliminate the need for a more precise digital-to-analog converter for use as a reference device (i.e. the bucking DAC as discussed above).

When comparing the intermediate signals (e.g., comparing first intermediate signal 18 to second intermediate signal 22; and comparing second intermediate signal 22 to first intermediate signal 18), comparator 20 may generate 112 output signal 30 that is based upon, at least in part, the difference between first intermediate signal 18 and second intermediate signal 22.

Figure 3:
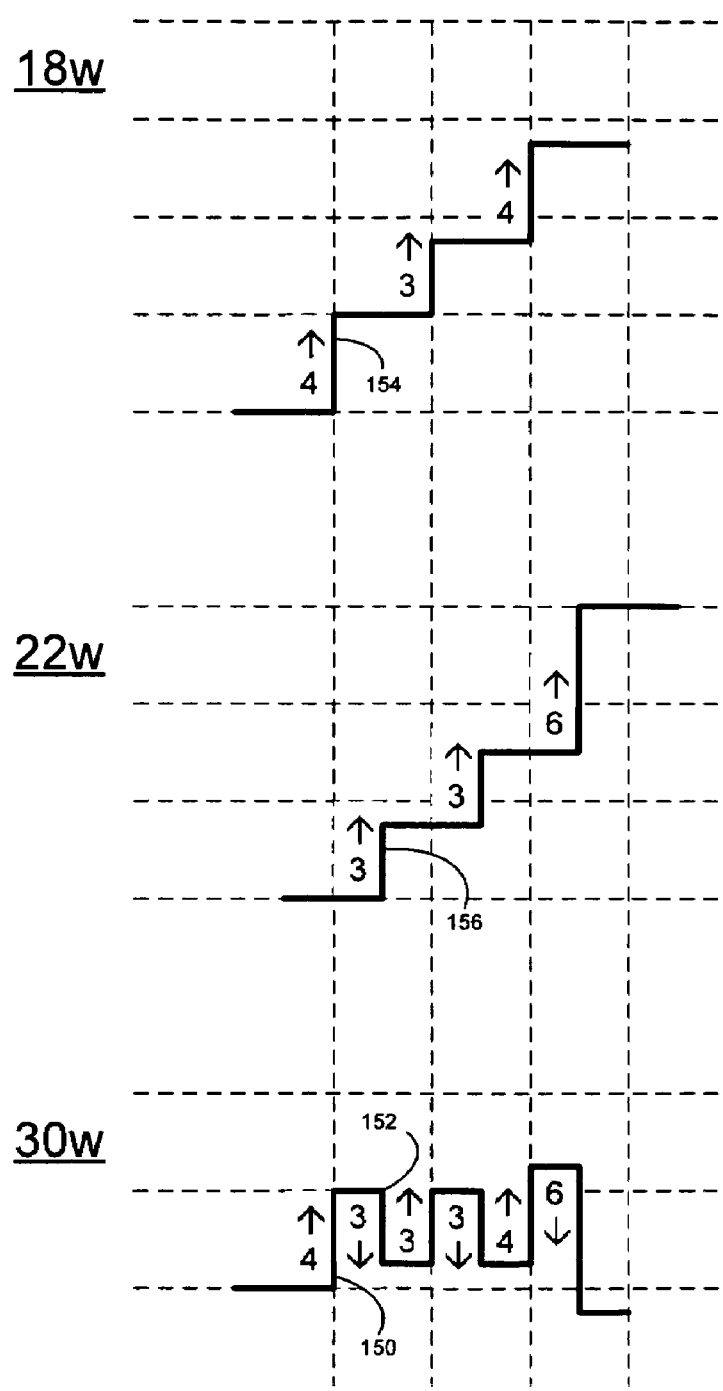
FIG. 3 is a diagrammatic view of a plurality of waveforms processed by the transfer function mapping system of FIG. 1.

Referring also to FIG. 3 and for illustrative purposes only, assume that first device 16 and second device 24 are both non-inverting devices, wherein the transfer function of a non-inverting device generates a monotonically increasing output in response to a monotonically increasing input. Further, assume for illustrative purposes that first reference signal generator 12 and second reference signal generator 28 are each configured to produce signals (first reference signal 14 and second reference signal 26) that include discrete transitions of monotonically increasing values (e.g. through the use of binary words or analog voltages). Further assume that waveform 18w is indicative (in this illustrative example) of first intermediate signal 18, and that waveform 22w is indicative (in this illustrative example) of second intermediate signal 22, wherein waveform 22w lags waveform 18w by essentially half of a period.

Additionally, assume that waveform 30w is indicative (in this illustrative example) of output signal 30 generated by comparator 20. As discussed above, in this particular example, second intermediate signal 22 (as illustrated with waveform 22w) is shifted (i.e., time delayed) with respect to first intermediate signal 18 (as illustrated via waveform 18w). Accordingly, output signal 30 (as illustrated by waveform 30w) roughly resembles a variable amplitude square wave. Specifically, while waveform 18w and waveform 22w both initially start out at essentially the same level, waveform 18w rises (e.g., four units) prior to waveform 22w (resulting in waveform 30w rising four units). When waveform 22w subsequently rises three units, waveform 30 falls three units. Waveform 30w may stay low until waveform 18w rises three units, at which point waveform 30w rises three units. The above-described transitions are for illustrative purposes only and are specific (in this example) to the particular polarities and connections of comparator 20.

The above-describe waveforms (waveforms 18w, 22w and 30w) are merely for illustrative purposes only and are not intended to be a limitation of this disclosure, as other waveforms may be utilized. Specifically, first device 16 and/or second device 24 may not be non-inverting. Further, first reference signal 14 and or second reference signal 26 may not monotonically increase.

Processor 32 may determine one or more anticipated differential changes in output signal 30. For example, processor 32 may determine 114 a first anticipated differential change (not shown) in output signal 30 based upon a transition in first reference signal 14. Further, processor 32 may determine 116 a second anticipated differential change (not shown) in output signal 30 based upon a transition in second reference signal 26.

Processor 32 may execute one or more instruction sets and/or subroutines in order to effectuate the functionality of transfer function mapping system 10. These instruction sets and/or subroutines may be stored on a storage device (not shown) accessible by processor 32. Examples of the storage device (not shown) may include but are not limited to a hard disk drive, a tape drive, an optical drive, a RAID array, a random access memory (RAM), or a read-only memory (ROM).

When processor 32 is determining 114, 116 the first anticipated differential change and the second anticipated differential change (respectively), various methodologies may be utilized. For example and for illustrative purposes only, processor 32 may determine an anticipated differential change in output signal 30 by accessing pre-stored values of anticipated differential changes, which may be stored within the above-described storage device (not shown) accessible by processor 32.

Alternatively, processor 32 may determine an anticipated differential change in output signal 30 by calculation, which may be accomplished e.g. by: monitoring either of first reference signal 14 or second reference signal 26; accessing pre-stored information regarding one or more transitions in first reference signal 14 or second reference signal 26; accessing pre-stored information of the details of the operational characteristics of first device 16 or second device 24; and/or accessing pre-stored mappings of the transfer function ideally implemented by first device 16 or second device 24.

For example, assume that first device 16 and second device 24 are each non-inverting amplifiers having a gain set to four. Further, assume that reference signals 14, 26 are analog reference signals having an initial value of 100 millivolts. Accordingly, if first device 16 and second device 24 are each operating ideally, first intermediate signal 18 and second intermediate output signal 22 would each have a value of 4 (0.100 volts) or 0.400 volts.

Assume for illustrative purposes that first reference signal 14 and second reference signal 26 are each incremented upward one millivolt (e.g., from 100 millivolts to 101 millivolts). Accordingly, processor 32 may determine 114 the first anticipated differential change (not shown) in output signal 30 based upon the one millivolt transition in first reference signal 14. Specifically, since first device 16 has a gain of four (as discussed above), the first anticipated differential change (as determined 114 by processor 32) would be 4 (0.001 volts) of 0.004 volts. Further, processor 32 may determine 116 the second anticipated differential change (not shown) in output signal 30 based upon the one millivolt transition in second reference signal 26. Specifically, since second device 24 also has a gain of four (as discussed above), the second anticipated differential change (as determined 116 by processor 32) would be 4 (0.001 volts) of 0.004 volts.

Processor 32 may measure one or more realized differential changes in output signal 30. For example, processor 32 may measure 118 a first realized differential change (not shown) in output signal 30 based upon a transition in first reference signal 14. Further, processor 32 may measure 120 a second realized differential change (not shown) in output signal 30 based upon a transition in second reference signal 26.

For example, processor 32 may measure a realized differential change in output signal 30 by measuring a leading-edge rise (e.g., leading edge rise 150) or a trailing-edge fall (e.g., trailing edge fall 152) within output signal 30. For example, voltage monitoring circuitry (not shown) may be incorporated into transfer function mapping system 10. Accordingly and utilizing such voltage monitoring circuitry (not shown), transfer function mapping system 10 may monitor the voltage level of output signal 30 just before and just after leading edge rise 150 (which corresponds with leading edge rise 154 in waveform 18w and a corresponding leading edge rise (not shown) in first reference signal 14) to measure 118 the first realized differential change (not shown) in output signal 30 based upon the transition in first reference signal 14. For illustrative purposes only and as illustrated in waveform 18w, assume that transfer function mapping system 10 measures 118 a first realized differential change of 0.004 volts.

As discussed above, processor 32 may measure a realized differential change in output signal 30 by measuring a trailing-edge fall (e.g., trailing edge fall 152) within output signal 30. Accordingly and utilizing the above-described voltage monitoring circuitry (not shown), transfer function mapping system 10 may monitor the voltage level of output signal 30 just before and just after trailing edge fall 152 (which corresponds with leading edge rise 156 in waveform 22w and a corresponding leading edge rise (not shown) in second reference signal 26) to measure 120 the second realized differential change (not shown) in output signal 30 based upon the transition in second reference signal 26. For illustrative purpose only and as illustrated in waveform 22w, assume that transfer function mapping system 10 measures 120 a second realized differential change of 0.003 volts.

An example of the above-described voltage monitoring circuitry may include but is not limited to an analog-to-digital converter that converts output signal 30 into a digital signal, thereby allowing processor 32 to measure 118, 120 the first and second differential change (respectively) in output signal 30.

Once transfer function mapping system 10 determines 114, 116 the first and second anticipated differential changes (respectively) and measures 118, 120 the first and second realized differential changes (respectively) in output signal 30, processor 32 of transfer function mapping system 10 may compare the anticipated differential changes to the realized differential changes to determine a nonlinearity indicator.

For example and continuing with the above-stated example, the first and second anticipated differential changes were determined 114, 116 to be 0.004 volts each. Further, the first and second realized differential changes were measured 118, 120 to be 0.004 volts and 0.003 volts (respectively). Accordingly, processor 32 within transfer function mapping system 10 may compare 122 the first anticipated differential change (i.e., 0.004 volts) to the first realized differential change (i.e., 0.004 volts) and calculate 124 a first nonlinearity indicator of 0.000 volts (i.e., 0.004 volts–0.004 volts). Further, processor 32 within transfer function mapping system 10 may compare 126 the second anticipated differential change (i.e., 0.004 volts) to the second realized differential change (i.e., 0.003 volts) and calculate 128 a second nonlinearity indicator of 0.001 volts (i.e., 0.004 volts–0.003 volts).

Once the first and second nonlinearity indicators are calculated 124, 128 (respectively), the first and second nonlinearity indicators may be output 130, 132 (respectively) to e.g., storage devices, display devices, printing devices, downstream processing devices, or various other output devices (collectively referred to as output devices 34). Additionally, by determining 114, 116, measuring 118, 120, and comparing 122, 126 multiple differential changes over a period of time, a plurality of nonlinearity indicators may be determined 124, 128 as a result of a series of transitions, wherein this plurality of nonlinearity indicators may be output 130, 132 (respectively) for subsequent processing.

Through the use of transfer function mapping system 10, two devices may be tested in a series of alternating transitions. For example, first reference signal 14 may increase monotonically in discrete increments (e.g. an increasing binary word value or an analog voltage increasing in discrete steps) and first device 16 and second device 24 may be two similar devices (e.g. two amplifiers being tested from within a single production run). In such a case, if second reference signal generator 28 generates 106 second reference signal 26 as a delayed representation of first reference signal 14, output signal 30 may look similar to waveform 30w, wherein each leading edge of output signal 30 is responsive to a transition in first intermediate signal 18 (i.e., which is indicative of the nonlinearity of first device 16) and each trailing edge of output signal 30 is responsive to a transition in second intermediate signal 22 (i.e., which is indicative of the nonlinearity of second device 24). Accordingly, processor 32 may determine 124, 128 nonlinearity indicators for each of first device 16 and second device 24 (respectively) by measuring 118 the "leading edge" realized differential changes and measuring 120 the "trailing edge" realized differential changes (respectively) in output signal 30 and comparing 122, 126 the realized differential changes with the anticipated differential changes that were determined 114, 116 by transfer function mapping system 10.

While system 10 is described above as testing a first device 16 and a second device 24, this is for illustrative purposes only and is not intended to be a limitation of this disclosure. Accordingly, the system may be expanded to test multiple devices. For example, a third device and a fourth device (not shown) may also be tested by transfer function mapping system 10. These additional devices would generate a third intermediate signal and a fourth intermediate signal (respectively, not shown), wherein the transitions in any one of the four intermediate signals are time-shifted from transitions in each of the other intermediate signals. Each rising or falling edge of the resulting output signal may then be responsive to a transition in a particular intermediate signal and therefore indicative of the nonlinearity of the respective device generating the particular intermediate signal. Accordingly, processor 32 may calculate nonlinearity indicators for each of the four devices by comparison of anticipated and realized differential changes as described above.

Transfer function mapping system 10 may be implemented as automated test equipment, wherein comparator 20, processor 32, first reference signal generator 12, and second reference signal generator 28 are all provided in an apparatus that further supplies a connection point for each of first device 16 and second device 24 to be connected by the user. When implemented as automated test equipment, the number of devices being tested may be expanded to an n-device system as previously discussed.

Transfer function mapping system 10 may also be incorporated into the device to be tested (e.g., first device 16 and/or second device 24), thus allowing for self-analysis and/or self-configuration of the device into which transfer function mapping system 10 is incorporated. For example, a digital-to-analog converter may incorporate a comparator and processor to perform the same or similar functions as comparator 20 and processor 32 as disclosed above. Accordingly, a series of transitions may be analyzed at power up (e.g. as a power on self test) or at intervals during operation to allow for self-calibration with respect to one or more calculated nonlinearities.

One or more of first reference signal 14 (and corresponding first intermediate signal 18) and second reference signal 26 (and corresponding second intermediate signal 22) may be sawtooth waveforms. Transfer function mapping system 10 may execute a phase alignment process (with respect to one or more of first reference signal 14, corresponding first intermediate signal 18, second reference signal 26 and/or corresponding second intermediate signal 22) to allow for easier correlation between the input signal(s) applied to e.g., comparator 20 and the various edges of output signal 30.

Transfer function mapping system 10 may accomplish this phase alignment in various ways and this disclosure is not intended to be limited to any particular alignment process. As an illustrative example, transfer function mapping system 10 may e.g., process a portion of the digital samples that define one or more of the above-described signals. The processing performed by transfer function mapping system 10 may include (but is not limited to) averaging and/or balancing the individual digital samples. Due to the repetitive nature of the digital samples, the processed digital samples may be examined to determine e.g., the point at which multiple null positions exist. These multiple null positions may then be used for phase alignment purposes.

A number of implementations have been described. Nevertheless, it will be understood that various modifications may be made. Accordingly, other implementations are within the scope of the following claims.

What is claimed is:

1. A method for mapping system transfer functions comprising:
   receiving a first intermediate signal at a comparator that is at least partially based upon a first reference signal from a first reference signal generator;
   receiving a second intermediate signal at the comparator that is at least partially based upon a second reference signal from a second reference signal generator;
   generating an output signal at the comparator that is based upon the difference between the first intermediate signal and the second intermediate signal;
   determining, at a processor, a first anticipated differential change in the output signal, the first anticipated differential change to occur based upon a transition in the first reference signal;
   determining, at the processor, a second anticipated differential change in the output signal, the second anticipated differential change to occur based upon a transition in the second reference signal;
   measuring, at the processor, a first realized differential change in the output signal, the first realized differential change occurring based upon a transition in the first reference signal;
   measuring, at the processor, a second realized differential change in the output signal, the second realized differential change occurring based upon a transition in the second reference signal;
   comparing, at the processor, the first realized differential change in the output signal to the first anticipated differential change in the output signal to determine a first nonlinearity indicator; and
   comparing, at the processor, the second realized differential change in the output signal to the second anticipated differential change in the output signal to determine a second nonlinearity indicator.

2. The method of claim 1 wherein the first reference signal is a first digital reference signal.

3. The method of claim 2 wherein the first digital reference signal is provided to a device under test such that the device under test generates the first intermediate signal.

4. The method of claim 3 wherein the device under test includes a digital-to-analog converter.

5. The method of claim 1 wherein the first reference signal is a first analog reference signal.

6. The method of claim 5 wherein the first analog reference signal is provided to a device under test such that the device under test generates the first intermediate signal.

7. The method of claim 6 wherein the device under test includes an amplifier.

8. A system transfer function mapping circuit configured to perform operations comprising:
- a comparator configured to receive a first intermediate signal that is at least partially based upon a first reference signal from a first reference signal generator, the comparator further configured to receive a second intermediate signal that is at least partially based upon a second reference signal from a second reference signal generator, the comparator further configured to generate an output signal that is based upon the difference between the first intermediate signal and the second intermediate signal; and
- a processor configured to determine a first anticipated differential change in the output signal, the first anticipated differential change to occur based upon a transition in the first reference signal, the processor further configured to determine a second anticipated differential change in the output signal, the second anticipated differential change to occur based upon a transition in the second reference signal, the processor further configured to measure a first realized differential change in the output signal, the first realized differential change occurring based upon a transition in the first reference signal, the processor further configured to measure a second realized differential change in the output signal, the second realized differential change occurring based upon a transition in the second reference signal, the processor further configured to compare the first realized differential change in the output signal to the first anticipated differential change in the output signal to determine a first nonlinearity indicator, the processor further configured to compare the second realized differential change in the output signal to the second anticipated differential change in the output signal to determine a second nonlinearity indicator.

9. The circuit of claim 8 wherein the first reference signal is a first digital reference signal.

10. The circuit of claim 9 wherein the first digital reference signal is provided to a device under test, and where the device under test generates the first intermediate signal.

11. The circuit of claim 10 wherein the device under test includes a digital-to-analog converter.

12. The circuit of claim 8 wherein the first reference signal is a first analog reference signal.

13. The circuit of claim 12 wherein the first analog reference signal is provided to a device under test, and where the device under test generates the first intermediate signal.

14. The circuit of claim 13 wherein the device under test includes an amplifier.

15. A computer program product residing on a computer readable medium having a plurality of instructions stored thereon which, when executed by a processor, cause the processor to perform operations comprising:
- receiving a first intermediate signal at a comparator that is at least partially based upon a first reference signal from a first reference signal generator;
- receiving a second intermediate signal at the comparator that is at least partially based upon a second reference signal from a second reference signal generator;
- generating an output signal at the comparator that is based upon the difference between the first intermediate signal and the second intermediate signal;
- determining, at a processor, a first anticipated differential change in the output signal, the first anticipated differential change to occur based upon a transition in the first reference signal;
- determining, at the processor, a second anticipated differential change in the output signal, the second anticipated differential change to occur based upon a transition in the second reference signal;
- measuring, at the processor, a first realized differential change in the output signal, the first realized differential change occurring based upon a transition in the first reference signal;
- measuring, at the processor, a second realized differential change in the output signal, the second realized differential change occurring based upon a transition in the second reference signal;
- comparing, at the processor, the first realized differential change in the output signal to the first anticipated differential change in the output signal to determine a first nonlinearity indicator; and
- comparing, at the processor, the second realized differential change in the output signal to the second anticipated differential change in the output signal to determine a second nonlinearity indicator.

16. The computer program product of claim 15 wherein the first reference signal is a first digital reference signal.

17. The computer program product of claim 16 wherein the first digital reference signal is provided to a device under test such that the device under test generates the first intermediate signal.

18. The computer program product of claim 17 wherein the device under test includes a digital-to-analog converter.

19. The computer program product of claim 15 wherein the first reference signal is a first analog reference signal.

20. The computer program product of claim 19 wherein the first analog reference signal is provided to a device under test such that the device under test generates the first intermediate signal.

21. The computer program product of claim 20 wherein the device under test includes an amplifier.

* * * * *